United States Patent [19]
Pearsall

[11] 4,231,049
[45] Oct. 28, 1980

[54] HETEROJUNCTION PHOTODIODE OF THE AVALANCHE TYPE

[75] Inventor: Thomas Pearsall, Paris, France

[73] Assignee: Thomson-CSF, Paris, France

[21] Appl. No.: 958,385

[22] Filed: Nov. 7, 1978

[30] Foreign Application Priority Data

Nov. 10, 1977 [FR] France .................. 77 33916

[51] Int. Cl.² ...................... H01L 29/90; H01L 29/14
[52] U.S. Cl. ........................................ 357/13; 357/30; 357/16; 357/17
[58] Field of Search ........................ 357/30, 16, 13, 17

[56] References Cited

U.S. PATENT DOCUMENTS

| | | | |
|---|---|---|---|
| 3,921,192 | 11/1975 | Goronkin | 357/13 |
| 3,959,646 | 5/1976 | DeCremorex | 250/211 J |
| 4,016,586 | 4/1977 | Anderson | 357/2 |
| 4,053,918 | 10/1977 | Fletcher | 357/30 |
| 4,083,062 | 4/1978 | Ohuchi | 357/13 |

Primary Examiner—Martin H. Edlow
Attorney, Agent, or Firm—Oblon, Fisher, Spivak, McClelland & Maier

[57] ABSTRACT

A photodiode comprising a first layer of a relatively large forbidden band (e.g. 1.4 eV) in a p type of conductivity, wherein photons can be absorbed, thus creating pairs of electron-holes diffusing towards a second layer, said second layer having a forbidden band. (0.7 eV) that is approximately half of the first band. In that second layer of an n-type of conductivity each electron falls and creates by impact ionization a new pair electron-hole, thus producing an avalanche gain of 2. The phenomenon occurs theoretically with a zero bias voltage. In practice the photodiode operates with a bias voltage near zero. The two materials of the heterojunction are for instance In P (forbidden band: 1.4 eV) and $Ga_{0.47}In_{0.53}As$ (0.7 eV) providing crystalline networks perfectly matched.

3 Claims, 2 Drawing Figures

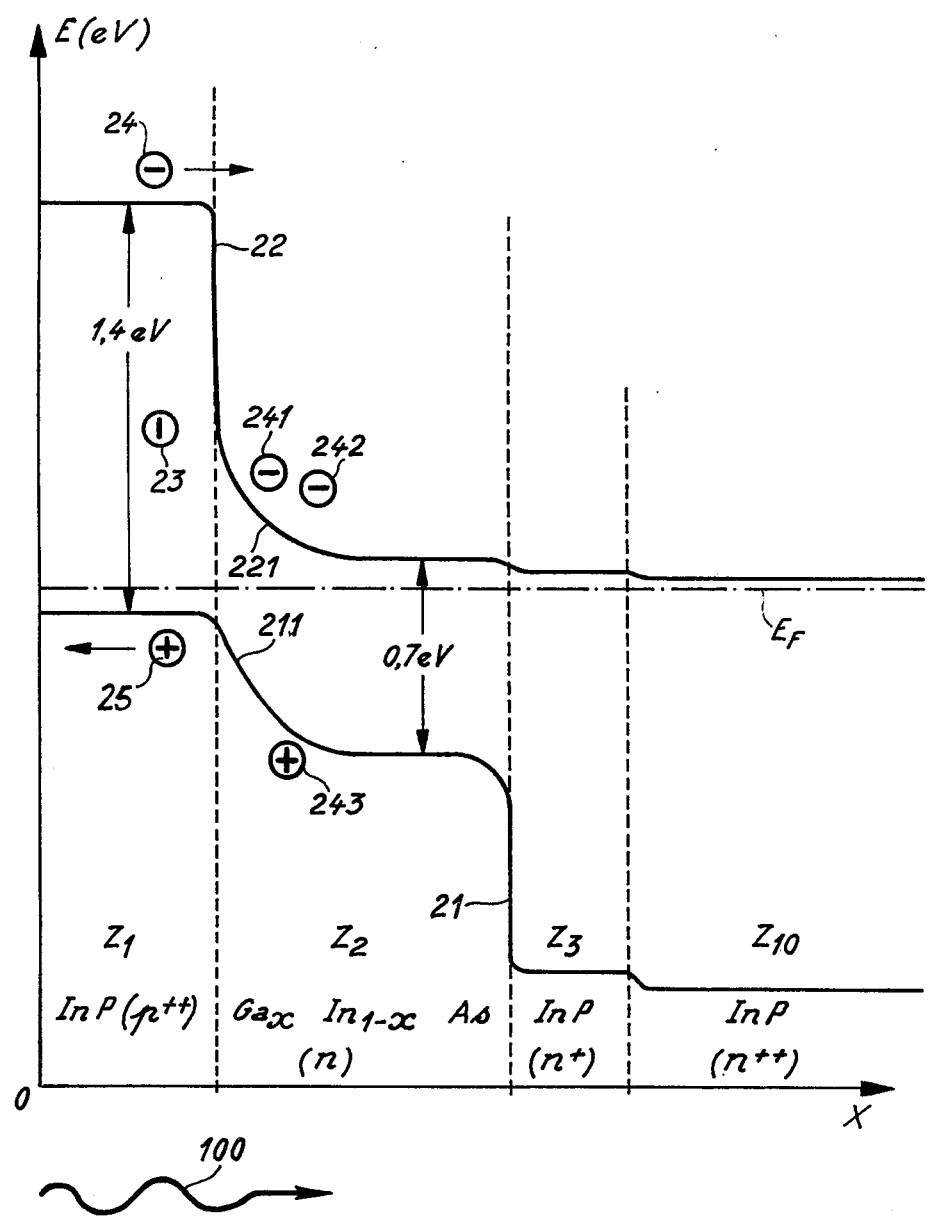

HETEROJUNCTION PHOTODIODE OF THE AVALANCHE TYPE

The invention concerns a photodiode of the avalanche type exhibiting a hetero junction structure, that is to say a semiconductor junction consisting of two different materials having opposite types of conductivity.

It is known that a photodiode is a diode intended to work with reverse bias and having in the vicinity of the semiconductor junction an active zone capable of absorbing photons by creating pairs of electron-holes, and as a result producing therefrom a reverse electric current whereof the amount is a direct function of the number of photons, that is to say of the intensity of photon-carrier radiation. In an avalanche diode, the phenomenon of impact ionisation participates in order to multiply the photon-detection current.

Hetero junction photodiodes have certain advantages as compared to photodiodes having a homogeneous semiconductor junction, more particularly as regards the detected current gain, the quantic efficiency and the lower bias voltage.

The invention enables some of these advantages to be accentuated, particularly the reduction in bias voltage.

According to the invention, there is provided an avalanche photodiode of the type comprising a semiconductor junction consisting of two different materials having opposite types of conductivity, comprising a first semiconductor layer intended to absorb photons having an energy greater than or equal to $E_1$, the material constituting this first layer exhibiting a forbidden band having a width of $E_2$ (expressed in energy), and a second semiconductor layer adjacent to the first layer and intended to serve as an avalanche zone, this second layer exhibiting a forbidden band having a width of $E_3$ (expressed in energy) and complying with the following double relationship:

$$E_1 > E_2 \geq 2E_3.$$

According to another feature of the invention, the first layer is an alloy of indium and phosphorus having the formula In P, and the second layer is an alloy of gallium, indium and arsenic having the formula:

$$Ga_xIn_{1-x}As \quad (1)$$

with $x = 0.47$ within a few thousandths.

In a variant of the invention, the second layer is an alloy of gallium and antimony having the formula Ga Sb, and the first layer is an alloy of aluminium, gallium and antimony having the formula:

$$Al_yGa_{1-y}Sb \quad (2)$$

with $y = 0.60$ within a few thousandths. The substrate is made of Ga Sb.

The invention will be better understood, and other features will appear, by means of the following description and the accompanying drawings, wherein:

FIG. 2 illustrates the structure of the valency and conduction bands in the example illustrated in FIG. 1.

Figure 1:
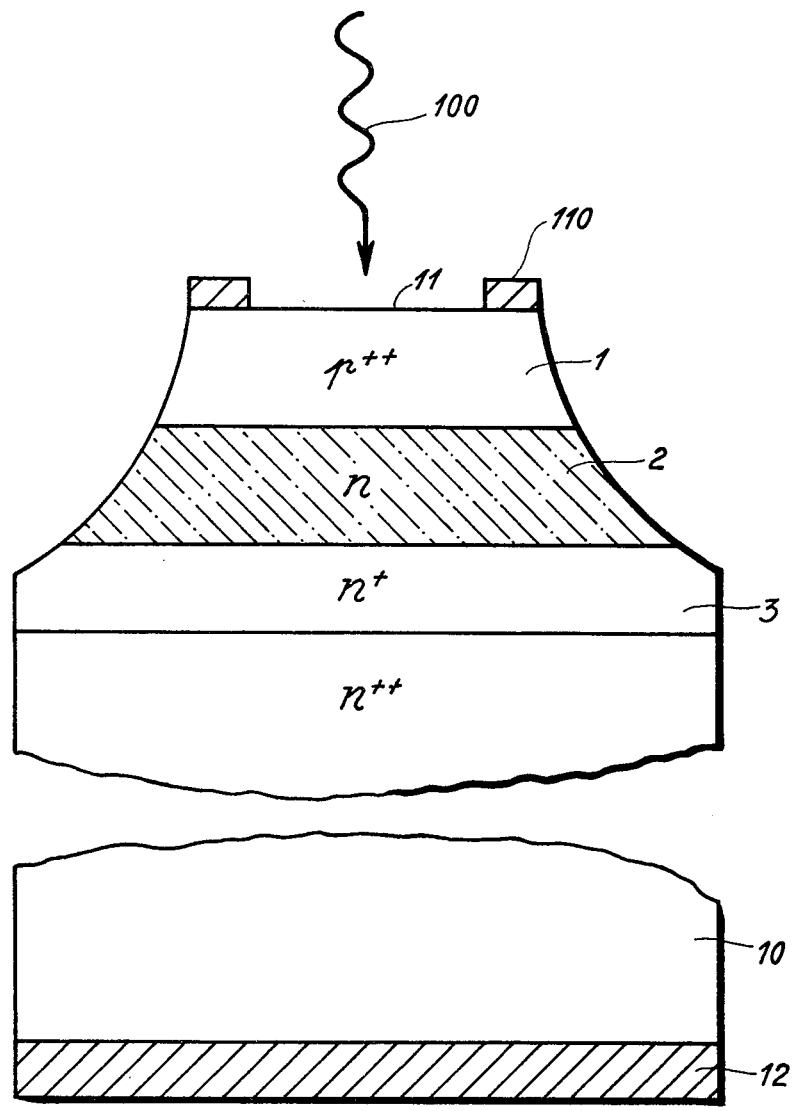
FIG. 1 illustrates in section an example of embodiment of the invention.

By way of an example of embodiment of the invention, FIG. 1 illustrates in section a photodiode comprising a substrate 10 of monocrystalline indium phosphide (In P) doped n++ with a density of donor atoms greater than $10^{18}$ cm$^{-3}$, for example $2.10^{18}$ cm$^{-3}$. The substrate 10 has received by successive epitaxies on one of its plane faces:

a layer 3 of very small thickness (for instance one micron, or possibly thicker) intended to serve as a buffer between the substrate and the active zones of the photodiode; it consists of indium phosphide In P of n+ doped with a density in impurities of $10^{18}$ cm$^{-3}$;

a layer 2 for instance, 5 microns thick for example, of n type monocrystalline alloy having the formula $Ga_{0.47}In_{0.53}As$, so doped as to obtain a density in donor atoms in $10^{16}$ cm$^{-3}$;

a thin layer 1, for example 2 microns thick, of p++ type monocrystalline In P alloy obtained by doping with acceptor atoms (Zn for example) to a density of $2.10^{18}$ cm$^{-3}$.

The layers 1 and 2 constitute the active zone of the photodiode, the layer 1 being intended to receive the radiation 100. Preliminary attack of the mesa type starting from the layer 1 has given the upper part the characteristic shape illustrated in FIG. 1.

The photodiode comprises two plane faces whereof one is for example a face 11 having a circular outline. Annular metallising 110 is deposited on the face 11 by evaporating metals or alloys (gold, indium, zinc) in vacuo so as to provide good ohmic contact while allowing the photons to pass.

Metallising 12 is applied to the free face of the substrate for example by evaporating gold, tin and tellurium in vacuo in order to obtain a good ohmic contact.

FIG. 2 illustrates, in the case of the aforementioned example (FIG. 1), the structure of the valence and conduction bands in the state of rest, that is to say in the absence of any external bias. The forbidden band is bounded by the curves 21 and 22. The energy levels are plotted on the ordinates (OE axis), the Fermi level being represented by a parallel $E_F$ to the axis of the abscissae Ox. The distances are counted along the Ox axis starting from the face 11 of the photodiode.

The structure comprises four zones:

$Z_1$ corresponding to the layer 1 which absorbs the photons from the radiation 100; in consequence of the strong type p doping, the forbidden band in the material (In P) of 1.4 volt is almost entirely above the Fermi level;

$Z_2$ corresponding to the layer 2, where the impact ionisation (avalanche) phenomenon takes place; at the junction between the p and n layers there is a discontinuity in the curve 22 situated entirely above $E_F$ and the linking curves 211 and 221 corresponding to a space-charge region. These linking curves are situated almost entirely in the weakly doped n type region; the prohibited band has a width of 0.7 volt which is characteristic of the material ($Ga_{0.47}In_{0.53}As$);

$Z_3$ and $Z_{10}$ corresponding respectively to the layer 3 and the substrate 10, more and more doped with n type, which explains the offset in successive steps from the forbidden band towards the low energy level. The forbidden band is 1.4 eV.

The photodiode according to the invention theoretically works with zero bias voltage and with an avalanche gain of 2. In practice, the effective bias voltage may be very low.

This result may be explained in the following manner with reference to the example described and illustrated:

(1.) In the layer 1 (zone $Z_1$, FIG. 2) each photon (23, FIG. 2) having an energy greater than 1.4 eV ($\lambda < 0.9$ micron) is absorbed, creating a pair of electron-holes (referenced 24 and 25, FIG. 2) because of the fact that the forbidden band of the material is 1.4 eV. In order, that almost all the photons of this energy may be absorbed, the layer 1 must be thick enough (at least one micron) without however being too thick (more than three to four microns) if it is desired that almost all of the electrons 24 shall be capable of diffusing into the layer 2.

(2.) In the layer 2 (zone $Z_2$, FIG. 2) there is a space-charge region serving as a transition between the zone of high electronic energy ($Z_1$) and the zone of low energy ($Z_2$). Any electron created by the photo-electric effect in zone $Z_1$ and then diffusing by thermal agitation into the layer 2 is subjected to the strong electric field in the space-charge region, and acquires a kinetic energy of the order of 0.7 volt.

In fact, the explanatory hypothesis that the reduction in level of the curve 22 is entirely in the conduction band is being formulated here. It results therefrom that the gain is kinetic energy of the electron 241 is equal to the difference between the forbidden bandwidths in eV, that is to say:

$$1.4 eV - 0.7 eV = 0.7 eV.$$

After falling, the electron 241 is capable, in the course of an impact ionisation, of causing an electron to rise from the valency band to the conduction band, which are separated by a reduction in level of 0.7 eV. An additional electron 242 is then liberated, as also is a hole 243, thus producing an avalanche gain of 2.

The layer 2 must be sufficiently thick for the electrons to be accelerated and the great majority of them to be impact ionised. A thickness of 5 microns seems to be sufficient. It is moreover advantageous to limit this thickness in order to reduce the avalanche voltage, and therefore the additional bias which has to be applied to the photodiode in order to have a gain of more than 2. In fact, when reverse bias is applied (negative pole on the p side, that is to say on the face 11 of the photodiode and positive pole on the substrate) the Fermi level is offset towards high electron energies in zone $Z_1$, and towards low energies in zone $Z_2$, which accentuates the height by which the electrons fall in the space-charge region, and therefore their kinetic energy and finally the avalanche gain by a conventional effect.

The value of the parameter x in formula (1) of the alloy of gallium, indium and arsenic is particularly critical (x=0.47), since if the value of 0.47 is departed from by a positive or negative amount beyond a few thousandths of this value, the crystalline networks of the two materials have meshes of different dimensions, and when In P grows of epitaxy on the alloy of formula (1) interface faults occur, and can cause recombinations of electrons and holes produced by the photo-electric effect, thus impairing the efficiency of the photodiode.

In the variant of the photodiode already mentioned containing an absorption layer of formula (2), the structure may be inferred from that illustrated in FIG. 1 by replacing the materials hereinbefore indicated by the following:

in layer 1, a crystal of $Al_{0.6}Ga_{0.4}Sb$ having a forbidden band of the order of 1.4 eV;

in layer 2, a crystal of Ga Sb having a forbidden band in the vicinity of 0.7 eV;

in the layer 3, and forming the substrate 10, a monocrystal of Ga Sb.

In this variant, there is no perfect matching between the crystalline networks of layers 1 and 2. The ohmic contact 110 is of poorer quality than in the case In P because of the presence of aluminium in layer 1. The efficiency of the photodiode is poorer to a greater extent than that of the foregoing example.

In all the examples of photodiodes, the p and n types of conductivity may be interchanged provided that the polarities of the voltages to be applied to the ohmic contacts of the photodiode are reversed.

What I claim is:

1. An avalanche photodiode of the type provided with a semiconductor junction consisting of two different materials having opposite types of conductivity, comprising:

a first semiconductor layer of an alloy having the formula In P, intended to absorb photons the energy of which is greater than or equal to $E_1$, the material constituting said first layer exhibiting a forbidden band gap having a width of $E_2$, expressed in energy;

a second semiconductor layer adjacent to the first layer, and formed of an alloy having the formula $$Ga_x In_{1-x} As$$

wherein x=0.47 within a few thousandths, said second layer exhibiting a forbidden band gap having a width of $E_3$, expressed in energy;

a monocrystalline substrate having the formula In P;

said semiconductor junction being formed by said first layer having a first type of conductivity, which is strongly doped, and said second layer having an opposite type of conductivity, less doped than the first layer, the energies $E_1$, $E_2$ and $E_3$ complying with the following double relationship:

$$E_1 > E_2 \geq 2E_3.$$

2. An avalanche photodiode of the type provided with a semiconductor junction consisting of two different materials having opposite types of conductivity, comprising:

a first semiconductor layer of an alloy having the formula Ga Sb, intended to absorb photons the energy of which is greater than or equal to $E_1$, the material constituting said first layer exhibiting a forbidden band gap having a width of $E_2$, expressed in energy;

a second semiconductor layer adjacent to the first layer, and formed of an alloy having the formula $$Al_y Ga_{1-y} Sb$$

wherein y=0.61 within a few thousandths, said second layer exhibiting a forbidden band gap having a width of $E_3$, expressed in energy;

a monocrystalline substrate having the formula Ga Sb;

said semiconductor junction being formed by said first layer having a first type of conductivity, which is strongly doped, and said second layer having an opposite type of conductivity, less doped than the first layer, the energies $E_1$, $E_2$ and $E_3$ complying with the following double relationship:

$$E_1 > E_2 \geq 2E_3.$$

3. An avalanche photodiode of the type provided with a semiconductor junction consisting of two different materials having opposite types of conductivity, comprising:
- a first semiconductor layer intended to absorb photons having an energy greater than or equal to $E_1$, the material constituting said first layer exhibiting a forbidden band gap having a width of $E_2$ (expressed in energy);
- a second semiconductor layer adjacent to the first layer and intended to serve as an avalanche zone;
- said second layer exhibiting a forbidden band gap having a width of $E_3$ (expressed in energy) and complying with the following double relationship, $$E_1 > E_2 \gtrsim 2E_3;$$

said avalanche photodiode comprising a first p (or n) doped layer with a density in acceptor (or donor) atoms of $2.10^{18}$ cm$^{-3}$, a second n (or p) doped layer with a density in donor (or acceptor) atoms of the order of $10^{16}$ cm$^{-3}$, a third layer, serving as a buffer, of an alloy identical with that of which the substrate consists, n (or p) doped and with a density in donor (or acceptor) atoms of the order of $10^{18}$ cm$^{-3}$, and an n (or p) doped substrate with a density in donor (or acceptor) atoms of the order of $2.10^{18}$ cm$^{-3}$.

* * * * *

UNITED STATES PATENT AND TRADEMARK OFFICE
CERTIFICATE OF CORRECTION

PATENT NO. : 4,231,049
DATED : October 28, 1980
INVENTOR(S) : Thomas Pearsall

It is certified that error appears in the above-identified patent and that said Letters Patent are hereby corrected as shown below:

Column 4 - line 46, delete "Ga Sb" and insert --$Al_y Ga_{1-y} Sb$--.

Column 4 - between lines 50 and 51 insert

--wherein y = 0.61 within a few thousandths;--.

Column 4 - line 54, delete "$Al_y Ga_{1-y} Sb$" and insert --Ga Sb--.

Column 4 - line 56, delete "wherein y = 0.61 within a few thousandths,".

Signed and Sealed this

Nineteenth Day of May 1981

[SEAL]

Attest:

RENE D. TEGTMEYER

Attesting Officer  Acting Commissioner of Patents and Trademarks